US012292605B2

United States Patent
Lee et al.

(10) Patent No.: US 12,292,605 B2
(45) Date of Patent: May 6, 2025

(54) SILICONIZED HETEROGENEOUS OPTICAL ENGINE

(71) Applicant: ROCKLEY PHOTONICS LIMITED, Altrincham (GB)

(72) Inventors: Seungjae Lee, San Jose, CA (US); Chia-Te Chou, Brea, CA (US); Vivek Raghunathan, Mountain View, CA (US); Brett Sawyer, Pasadena, CA (US)

(73) Assignee: Rockley Photonics Limited, Altrincham (GB)

( * ) Notice: Subject to any disclaimer, the term of this patent is extended or adjusted under 35 U.S.C. 154(b) by 208 days.

(21) Appl. No.: 17/641,418

(22) PCT Filed: Sep. 11, 2020

(86) PCT No.: PCT/EP2020/075467
§ 371 (c)(1),
(2) Date: Mar. 8, 2022

(87) PCT Pub. No.: WO2021/048349
PCT Pub. Date: Mar. 18, 2021

(65) Prior Publication Data
US 2022/0336433 A1  Oct. 20, 2022

Related U.S. Application Data

(60) Provisional application No. 62/899,073, filed on Sep. 11, 2019.

(51) Int. Cl.
*G02B 6/42* (2006.01)
*H01L 23/00* (2006.01)

(52) U.S. Cl.
CPC ......... *G02B 6/4257* (2013.01); *G02B 6/4274* (2013.01); *H01L 24/48* (2013.01);
(Continued)

(58) Field of Classification Search
CPC ........ G02B 6/42–43; G02B 2006/4297; H01L 24/00–98; H01L 2224/00–98
See application file for complete search history.

(56) References Cited

U.S. PATENT DOCUMENTS 9,349,610 B2 * 5/2016 Whang ................... H01L 25/18
11,493,714 B1 * 11/2022 Mendoza ................ G02B 6/13
(Continued)

FOREIGN PATENT DOCUMENTS

| GB | 2567047 A | 4/2019 |
|---|---|---|
| WO | 2018/127531 A1 | 7/2018 |
| WO | WO 2019/025858 A1 | 2/2019 |

OTHER PUBLICATIONS

International Search Report and Written Opinion of the International Searching Authority, mailed Nov. 23, 2020, corresponding to PCT/EP2020/075467, 9 pages.
(Continued)

*Primary Examiner* — Daniel Petkovsek
*Assistant Examiner* — Emma R. Oxford
(74) *Attorney, Agent, or Firm* — Womble Bond Dickinson (US) LLP

(57) ABSTRACT

A siliconized heterogeneous optical engine. In some embodiments, the siliconized heterogeneous optical engine includes a photonic integrated circuit; an electro-optical chip, on a top surface of the photonic integrated circuit; an electronic integrated circuit, on the top surface of the photonic integrated circuit; an interposer, on the top surface of the photonic integrated circuit; a redistribution layer, on a top surface of the interposer, the redistribution layer including a plurality of conductive traces; and a plurality of protruding conductors, on the conductive traces of the redistribution layer. The electronic integrated circuit may be electrically connected to the electro-optical chip and to a
(Continued)

conductive trace of the plurality of conductive traces of the redistribution layer.

13 Claims, 8 Drawing Sheets

(52) U.S. Cl.
CPC .............. *H01L 2224/48091* (2013.01); *H01L 2224/48105* (2013.01); *H01L 2224/48145* (2013.01); *H01L 2224/48157* (2013.01); *H01L 2224/48465* (2013.01); *H01L 2224/49109* (2013.01)

(56) References Cited

U.S. PATENT DOCUMENTS

| | | | | |
|---|---|---|---|---|
| 2009/0243069 | A1* | 10/2009 | Camacho | H01L 23/49551 257/E21.511 |
| 2011/0122481 | A1 | 5/2011 | Ide et al. | |
| 2012/0301149 | A1* | 11/2012 | Pinguet | H01L 25/0652 398/115 |
| 2013/0308898 | A1* | 11/2013 | Doerr | G02B 6/12 385/14 |
| 2014/0269804 | A1* | 9/2014 | Lai | G02B 6/4206 372/50.21 |
| 2014/0321803 | A1* | 10/2014 | Thacker | G02B 6/4274 385/14 |
| 2016/0085038 | A1 | 3/2016 | Decker et al. | |
| 2017/0194309 | A1 | 7/2017 | Evans et al. | |
| 2018/0196196 | A1* | 7/2018 | Byrd | G02B 6/14 |
| 2018/0204831 | A1* | 7/2018 | Seidemann | H01L 23/481 |
| 2019/0041576 | A1* | 2/2019 | Byrd | G02B 6/12004 |
| 2019/0042964 | A1* | 2/2019 | Elsherbini | H01L 25/0652 |
| 2019/0044002 | A1* | 2/2019 | Byrd | G02B 6/428 |
| 2019/0146166 | A1* | 5/2019 | Wang | G02B 6/4246 385/14 |
| 2019/0219762 | A1 | 7/2019 | Lai et al. | |
| 2019/0333905 | A1* | 10/2019 | Raghunathan | H01L 23/49838 |
| 2020/0006304 | A1* | 1/2020 | Chang | H01L 23/48 |
| 2022/0115362 | A1* | 4/2022 | Mallik | G02B 6/425 |

OTHER PUBLICATIONS

U.K. Intellectual Property Office Combined Search and Examination Report, dated Feb. 16, 2021, for Patent Application No. GB2014308.7, 5 pages.

\* cited by examiner

SILICONIZED HETEROGENEOUS OPTICAL ENGINE

CROSS-REFERENCE TO RELATED APPLICATION(S)

The present application is a U.S. National Stage Patent Application of PCT/EP2020/075467, filed Sep. 11, 2020, which claims priority to and the benefit of U.S. Provisional Application No. 62/899,073, filed Sep. 11, 2019, entitled "SILICONIZED HETEROGENEOUS OPTICAL ENGINE", the entire content of each of which is incorporated herein by reference.

FIELD

One or more aspects of embodiments according to the present disclosure relate to optoelectronic packaging, and more particularly to a siliconized heterogeneous optical engine.

BACKGROUND

As data rates increase (e.g., from 25 Gb/s/lane in a 100 G transceiver, to 100 G/s/lane in a 400 G transceiver), it may be advantageous for the high-speed performance of optical engines to scale up accordingly. Certain fan-out wafer level packages (FOWLPs) may provide good performance but may employ time-consuming fabrication processes, and packages using flex/organic based substrate solutions may have relatively poor signal integrity performance.

Thus, there is a need for an improved package for an optical engine.

SUMMARY

According to an embodiment of the present disclosure, there is provided a system, including: a photonic integrated circuit; an electro-optical chip, on a top surface of the photonic integrated circuit; an electronic integrated circuit, on the top surface of the photonic integrated circuit; an interposer, on the top surface of the photonic integrated circuit; a redistribution layer, on a top surface of the interposer, the redistribution layer including a plurality of conductive traces; and a plurality of protruding conductors, on the conductive traces of the redistribution layer, the electronic integrated circuit being electrically connected to the electro-optical chip and to a conductive trace of the plurality of conductive traces of the redistribution layer.

In some embodiments, the interposer is composed of silicon.

In some embodiments, the interposer includes an upper surface passivation layer composed of silicon dioxide.

In some embodiments, one of the protruding conductors includes: a copper post, and a gold ball on the copper post.

In some embodiments, the gold ball is secured to the copper post with solder.

In some embodiments, the interposer is composed of an organic compound or a ceramic compound.

In some embodiments, one of the protruding conductors includes a gold ball on the redistribution layer.

In some embodiments, the gold ball is secured to the redistribution layer with solder.

In some embodiments, one of the protruding conductors includes: a solder ball, and a gold ball on the solder ball.

In some embodiments, the electronic integrated circuit is connected to the conductive traces of the redistribution layer by a standoff stitch bond.

In some embodiments, the electronic integrated circuit is connected to a conductive trace on the top surface of the photonic integrated circuit by a wire bond.

In some embodiments, the system further includes a protective lid enclosing: the electro-optical chip, a portion of the electronic integrated circuit, and a wire bond connecting the electro-optical chip to the electronic integrated circuit.

In some embodiments, the interposer has a thickness of between 50 microns and 500 microns.

In some embodiments, the electro-optical chip has a top surface at a height, above the top surface of the photonic integrated circuit, of less than 200 microns.

In some embodiments, a wire bond connecting the electro-optical chip to the electronic integrated circuit extends to a height of at most 100 microns above the top surface of the electro-optical chip.

In some embodiments, a wire bond between the electronic integrated circuit and the interposer extends to a height of at most 90 microns above the top surface of the electro-optical chip.

BRIEF DESCRIPTION OF THE DRAWINGS

These and other features and advantages of the present disclosure will be appreciated and understood with reference to the specification, claims, and appended drawings wherein:

DETAILED DESCRIPTION

The detailed description set forth below in connection with the appended drawings is intended as a description of exemplary embodiments of a siliconized heterogeneous optical engine provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Figure 1:
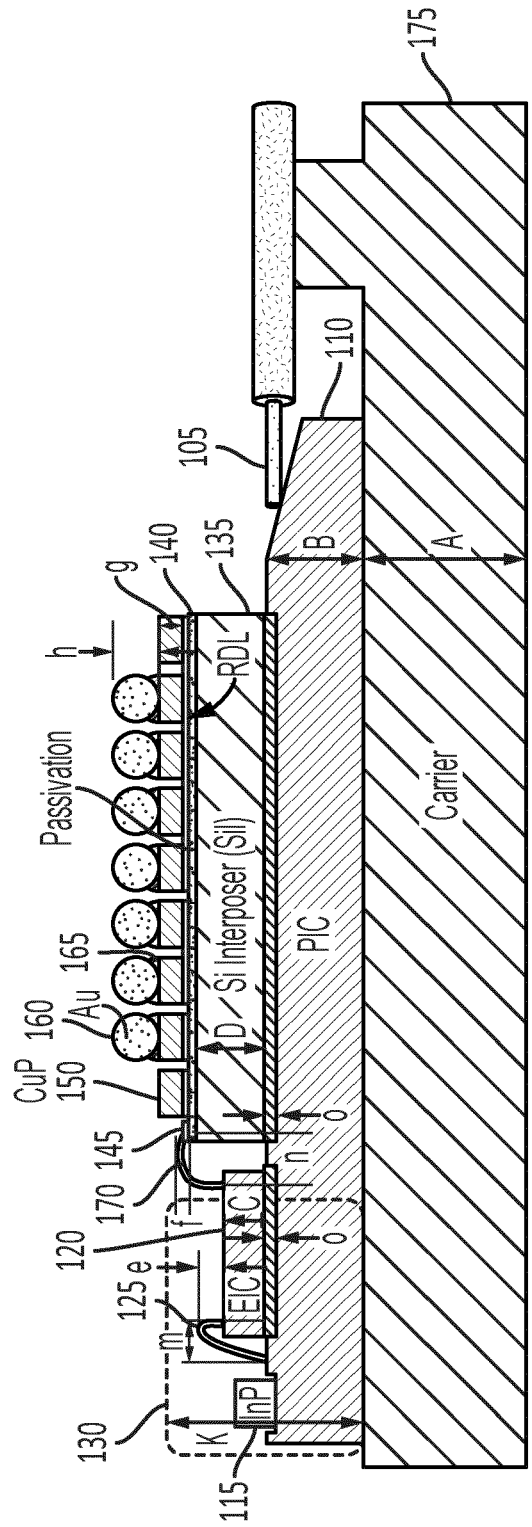
FIG. 1 is a side cross sectional view of an optical engine and an associated table of dimensions, according to an embodiment of the present disclosure.

FIG. 1 shows a side cross-sectional view of a siliconized heterogeneous optical engine, according to one embodiment. One or more optical fibers 105 deliver modulated light to (or receive modulated light from) a photonic integrated circuit (PIC) 110. The photonic integrated circuit 110 PIC includes one or more optical waveguides for forming one or more optical connections between the optical fibers and one or more electro-optical chips 115, each of which may include an optical modulator (for converting unmodulated light into light that is modulated with data) or a photodetector (or an array of modulators or of photodetectors). To this end, the photonic integrated circuit 110 may include V-grooves for aligning the optical fibers 105 to optical waveguides on the photonic integrated circuit 110. The photonic integrated circuit 110 may also include mode converters (e.g., tapered optical waveguides) for converting (i) an optical mode that is well matched to the optical mode of an optical fiber to (ii) an optical mode that can be conveniently routed on the photonic integrated circuit 110, and to (iii) an optical mode that is suitable (e.g., sufficiently small) to interact effectively with any of the electro-optical chips 115.

One or more electronic integrated circuits (EICs) 120 may act as interface circuits for adapting the electrical interfaces of the electro-optical chips 115 to digital interfaces of a digital integrated circuit (e.g., a switch ASIC that may perform packet switching) that may be connected to the electro-optical chips 115, as discussed in further detail below. For example, an electronic integrated circuit 120 that is connected to a modulator (or to an array of modulators) may include a driver circuit for driving the modulator (or an array of such driver circuits), and an electronic integrated circuit 120 that is connected to a photodetector (or to an array of photodetectors) may include a transimpedance amplifier (or an array of transimpedance amplifiers).

One or more cavities may be formed in the top surface of the photonic integrated circuit 110 to accommodate the electro-optical chips 115 (the cavities making possible the vertical alignment of waveguides on the electro-optical chips 115 and corresponding waveguides on the photonic integrated circuit 110). Each of the electro-optical chips 115 may be electrically connected to traces on the photonic integrated circuit 110 by flip chip bonds, and each of the electronic integrated circuits 120 may be electrically connected to the traces (and, thereby, to one or more corresponding electro-optical chips 115) by wire bonds 125. A protective metal cover or "lid" 130 (or "protective metal lid sealing" (PMLS)) may enclose the electro-optical chips 115, the wire bonds 125, and portions of the photonic integrated circuit 110 and of the electronic integrated circuits 120, as shown. The protective metal lid 130 may be made of aluminum alloy or copper and may be fabricated by punching or milling, for example. It may be positioned on the assembly by a pick and place machine and secured with conductive or non-conductive epoxy. The protective metal lid 130 may have a plurality of holes or perforations to reduce its stiffness, so as to reduce, in the presence of temperature changes or temperature gradients, the mechanical stress it may exert on the parts of the siliconized heterogeneous optical engine with which it is in contact. The protective metal lid 130 may protect, or help to protect, the parts that it encloses or partially encloses, including the wire bonds 125. In some embodiments a protective lid composed of a material that is not a metal (e.g., a protective lid composed of plastic) is used instead of a protective metal lid.

An interposer 135 (e.g., a silicon interposer, as shown in FIG. 1) may be secured (e.g., bonded, with epoxy) to the top surface of the photonic integrated circuit 110 and may have, on its top surface, a passivation layer 140 (e.g., a layer of polyimide (PI) or polybenzoxazole (PBO) or benzocyclobutene (BCB)), a redistribution layer (RDL) 145 on the passivation layer, a plurality of copper posts 150 on the redistribution layer, and a plurality of gold balls 160, each of the gold balls being on one of the copper posts. The surfaces of the copper posts may, for example, be pure copper, immersion tin, immersion gold, ENIG (electroless nickel immersion gold), or ENEPIG (electroless nickel electroless palladium immersion gold). In some embodiments, other materials (such as other suitable metals or alloys) are used instead of copper and gold for the posts and balls respectively; for example, copper core balls may be used instead of gold balls. The gold balls (e.g., gold coated balls) 160 may be soldered to the copper posts (i.e., secured to the copper posts with solder joints 165 formed using solder paste and reflow). In some embodiments, solder balls (secured to the copper posts 150 using flux and reflow) are used instead of, or in addition to, the gold balls 160. Standoff stitch bonds 170 may form electrical connections between the one or more electronic integrated circuits 120 and conductive traces in the redistribution layer 145. Additional copper posts 150 (such as the left-most one shown in FIG. 1) may be used to provide additional protection for the standoff stitch bonds 170, for example by preventing the digital integrated circuit from coming into contact with the standoff stitch bonds 170 during assembly. The protective metal lid 130 (or a similar plastic lid) may also provide protection for the standoff stitch bonds 170.

The conductive traces of the redistribution layer 145 may form connections to the copper posts 150, and thereby to the gold balls 160. The copper posts 150 and the gold balls 160 may act as protruding conductors on the redistribution layer 145 that make it possible, as mentioned above, to attach a digital integrated circuit (e.g., a switch ASIC, not shown in FIG. 1) to the gold balls and thereby to the redistribution layer 145. Such a digital integrated circuit may have an electrical interface including a socket (e.g., an elastomer socket) with which the plurality of gold balls 160 may form a connection. In such a configuration, the siliconized heterogeneous optical engine shown in FIG. 1 may operate as an interface to the digital integrated circuit, performing optical to electrical conversion of incoming data signals and electrical to optical conversion of outgoing data signals. The photonic integrated circuit 110 may be mounted on a carrier 175, which may also provide strain relief for the one or more optical fibers 105 as shown. The carrier may be made of AlSiC or of a copper-based alloy; the fiber may be secured to the carrier with epoxy.

The table in the lower part of FIG. 1 shows dimensions that may be employed in some embodiments, along with tolerances which may be observed during fabrication. In the table, "th." is an abbreviation for "thickness". For example, the bond line thickness (BLT) of the epoxy layer that secures the interposer 135 to the photonic integrated circuit 110 may be between 5 and 50 microns, and it may be formed, in fabrication, with a tolerance of +/−5 microns.

Figure 2:
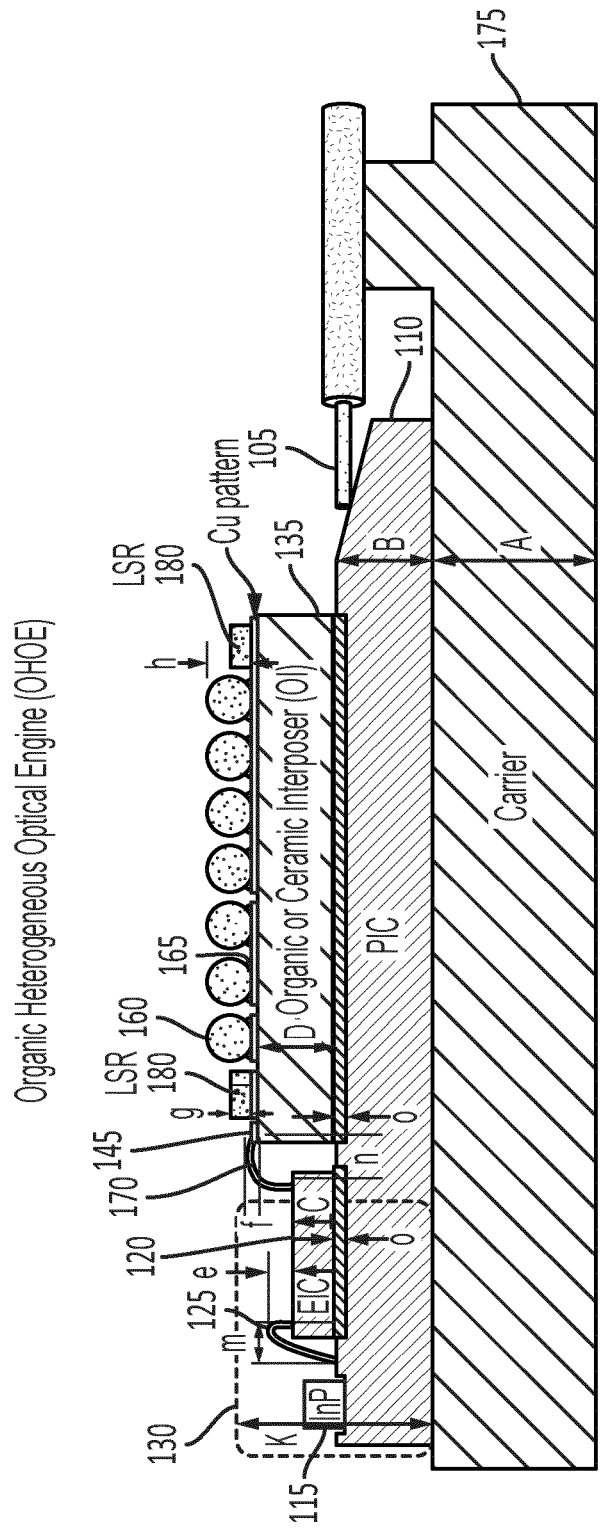
FIG. 2 is a side cross sectional view of an optical engine and an associated table of dimensions, according to an embodiment of the present disclosure.

FIG. 2 shows an organic heterogeneous optical engine according to some embodiments. The embodiment of FIG. 2 is similar to the embodiment of FIG. 1, with the principal difference being that in the embodiment of FIG. 2 the interposer 135 is composed of an organic or ceramic material instead of silicon, and the copper posts 150 (that are present in the embodiment of FIG. 1) are absent. The conductive traces of the redistribution layer 145 may be composed of copper, and the surfaces of the conductive traces of the redistribution layer 145 may, for example, be pure copper, immersion tin, immersion gold, ENIG (electroless nickel immersion gold), or ENEPIG (electroless nickel electroless palladium immersion gold). In the embodiment of FIG. 2, gold balls 160 are instead soldered directly to the conductive traces (or suitable pads connected to the conductive traces) of the redistribution layer (or "Cu pattern") 145. As a result of the absence of the copper posts 150, the standoff height of the gold balls 160 may be less than in the embodiment of FIG. 1 (and may be insufficient to permit a connection to be made to a digital integrated circuit), but this reduced standoff height may nonetheless be sufficient for installation of this optical engine on a motherboard (e.g., a printed circuit board). One or more land side registers (LSRs) 180, each of which may formed as a copper pattern (or a pattern of another metal or alloy) on a silicon or ceramic substrate, may protect the wire bonds from contact with, e.g., a motherboard onto which the organic heterogeneous optical engine is installed in the event that the carrier is tilted with respect to the motherboard as the two parts are brought together during installation. The protective metal lid 130 (or a similar plastic lid), or the copper cores of gold coated balls or of copper core balls, may also (or instead) provide protection for the standoff stitch bonds 170. The land side registers 180 may also perform an impedance-matching function, each acting as an open stub connected to the end of a respective standoff stitch bond 170; as such, each land side register 180 may compensate for the series inductance of a respective standoff stitch bond 170. In some embodiments, solder balls may be used in place of the gold balls 160, and in such an embodiment the land side registers 180 may perform a standoff function during soldering (by a reflow process) of the organic heterogeneous optical engine to, e.g., a motherboard. In other embodiments (suitable for soldering, e.g., to a motherboard), the gold balls 160 may be replaced with copper core balls. In the embodiments of FIG. 1 and FIG. 2, the gold balls 160 may be secured to the conductors below them with a reflow process, i.e., they may be placed on solder paste on the conductors below them, and the solder paste may then be heated to form a solder joint.

Figure 3:
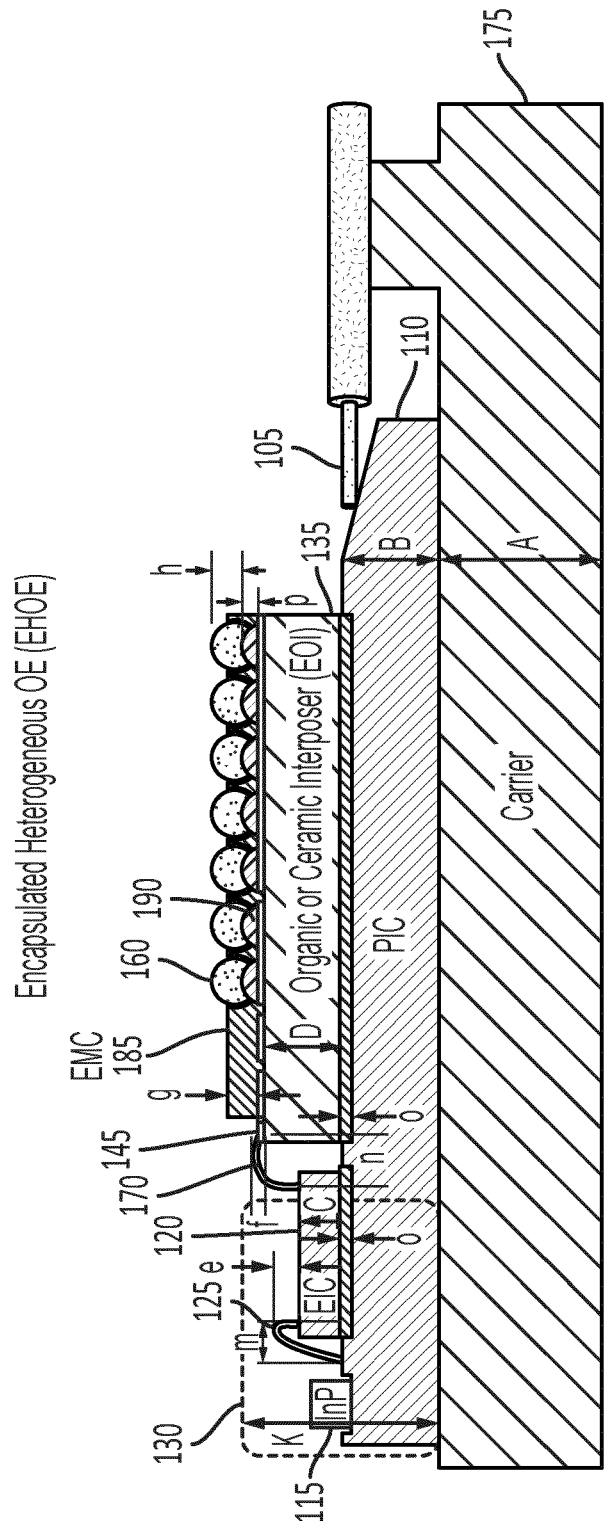
FIG. 3 is a side cross sectional view of an optical engine and an associated table of dimensions, according to an embodiment of the present disclosure.

FIG. 3 shows an encapsulated heterogeneous optical engine according to some embodiments. The embodiment of FIG. 3 is similar to the embodiment of FIG. 2, with the principal difference being that the embodiment of FIG. 3 includes a layer of epoxy mold compound (EMC) 185 on the redistribution layer (or "Cu patterns") 145 and on a plurality of solder balls 190, and surrounding, and extending between, the gold balls 160. The embodiment of FIG. 3 may be fabricated (as discussed in further detail below and described in FIG. 6) in part by securing the plurality of solder balls 190 on the redistribution layer 145 (e.g., using a first ball drop process), molding the layer of epoxy mold compound 185 over the plurality of solder balls 190, forming a plurality of holes in the layer of epoxy mold compound 185 (e.g., using laser ablation) and placing the gold balls 160 in the holes (e.g., using a second ball drop process). The gold balls 160 may be joined to the solder balls 190 by reflow with solder paste or flux.

The height of the gold balls 160 in the embodiment of FIG. 3 may be may greater than in the embodiment of FIG. 2 (e.g., because the gold balls 160 may be held, by the layer of epoxy mold compound 185, above the redistribution layer 145, and connected to the redistribution layer 145 by the solder balls 190), and may be suitable for direct attachment of a digital integrated circuit. In some embodiments the gold balls 160 may be replaced with copper core balls, or the solder balls 190 may be replaced with copper core balls, or both the gold balls 160 and the solder balls 190 may be replaced with copper core balls.

An embodiment in which both the gold balls 160 and the solder balls 190 have been replaced with copper core balls may be suitable for soldering to a motherboard; in such an embodiment, the layer of epoxy mold compound 185 may prevent a loss of alignment, during a reflow operation after the second ball drop process, between the ball at the bottom of each hole in the epoxy mold compound 185 and the ball at the top of the hole. In the embodiment of FIG. 3, the holes in the layer of epoxy mold compound 185 may have slightly smaller diameters, before the second ball drop process, than the balls (e.g., the gold balls 160); the balls may be pressed into the holes during the second ball drop process, causing the holes to become slightly enlarged, and causing the epoxy mold compound 185 to hold or "grip" the balls. As such, the epoxy mold compound 185 may (i) provide a standoff height for controlling the depth of insertion of the gold balls 160 into the socket for making a connection to the digital integrated circuit and (ii) reliably and accurately (e.g., with accurate XY tolerances, and at an accurately set height above the interposer 135) secure the gold balls 160 (or the copper core balls that may be used instead), enhancing reliability performance. The layer of epoxy mold compound 185 may, in the embodiment of FIG. 3, also protect the wire bonds from contact with the part (e.g. the digital integrated circuit) with which the encapsulated heterogeneous optical engine is to be connected. The protective metal lid 130 (or a similar plastic lid), or the copper cores of gold coated balls or of copper core balls, may also (or instead) provide protection for the standoff stitch bonds 170.

Figure 4:
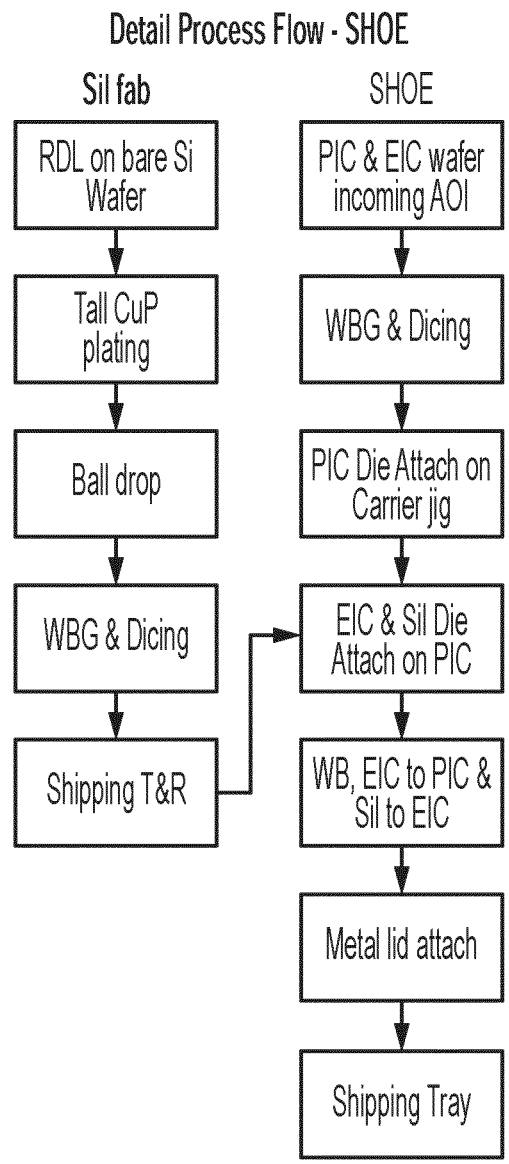
FIG. 4 is an assembly process flow chart, according to an embodiment of the present disclosure.
Figure 5:
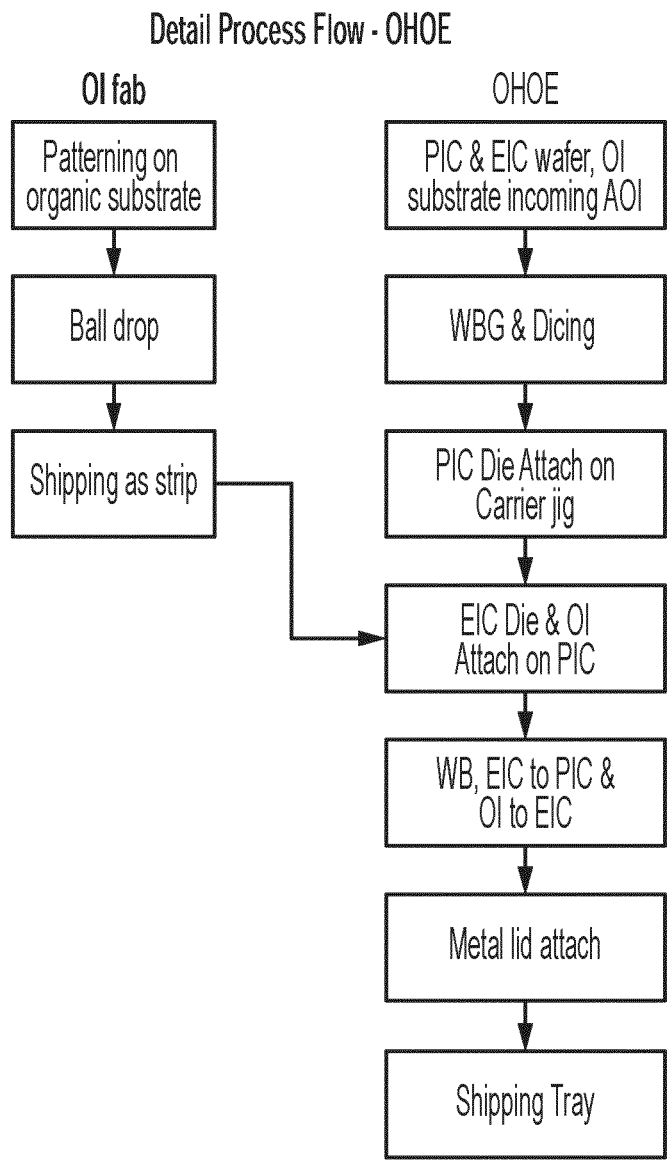
FIG. 5 is an assembly process flow chart, according to an embodiment of the present disclosure.
Figure 6:
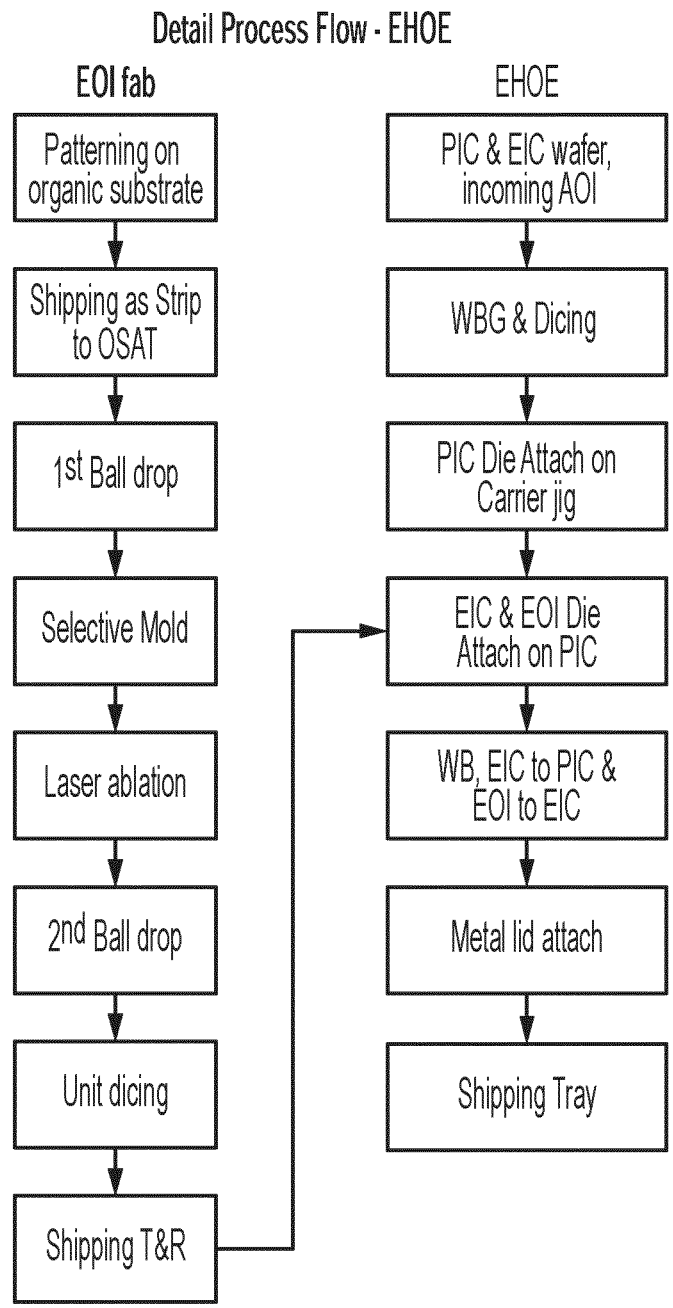
FIG. 6 is an assembly process flow chart, according to an embodiment of the present disclosure.
Figure 7:
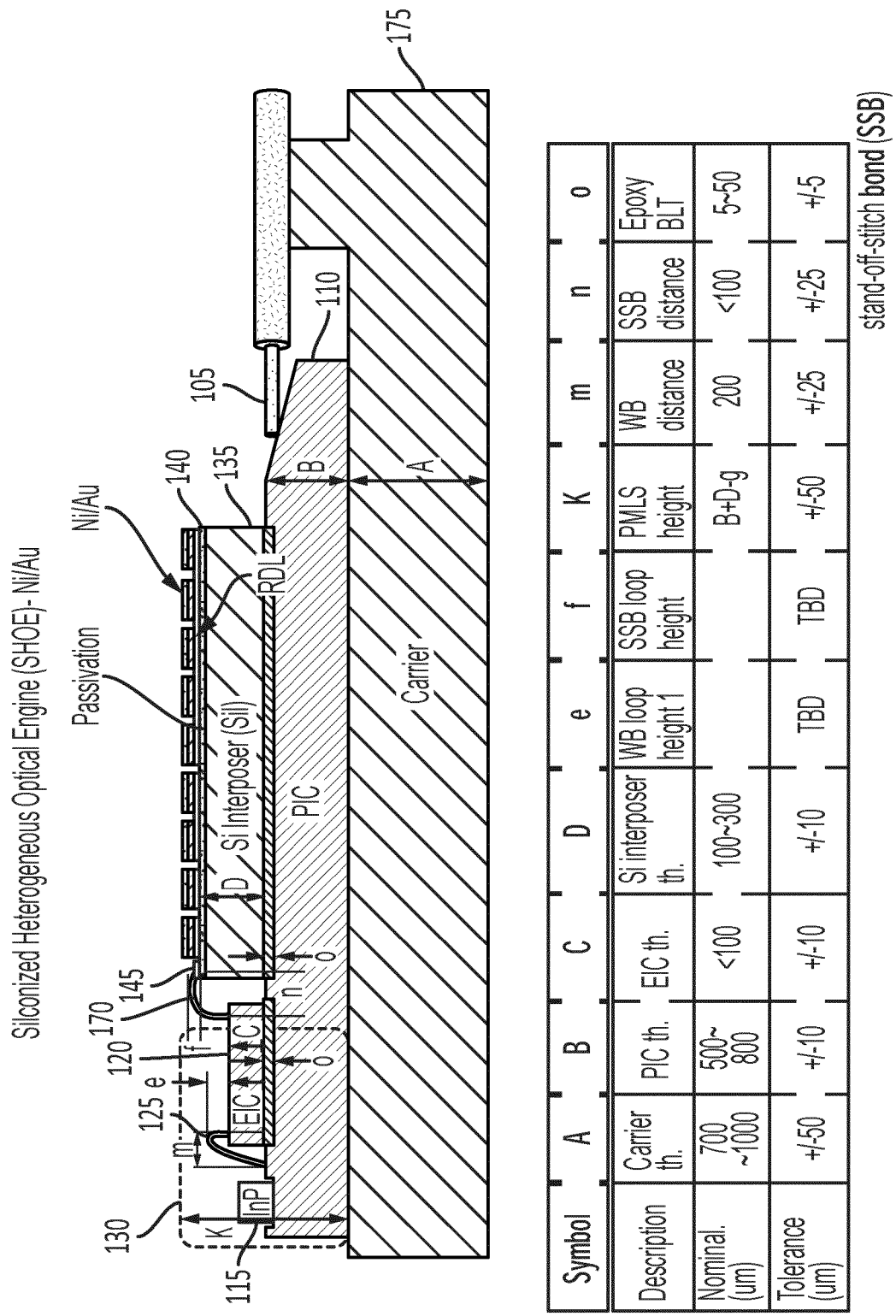
FIG. 7 is a side cross sectional view of an optical engine and an associated table of dimensions, according to an embodiment of the present disclosure.

FIGS. 4, 5, and 6 show assembly processes for the embodiments of FIGS. 1, 2, and 3, respectively. The following abbreviations are used in FIGS. 4, 5, and 6:

OI: organic interposer
CuP: copper post
AOI: Automatic optical inspection
WBG: wafer back grinding
SiI: Silicon interposer
OI: Organic interposer
EOI: EMC organic interposer
WB: wire bonding
OSAT: outsource assembly and test
T&R: Tape & Reel FIG. 7 shows a siliconized heterogeneous optical engine according to some embodiments. The embodiment of FIG. 7 is similar to the embodiment of FIG. 1, with the principal difference being that in the embodiment of FIG. 7 the copper posts 150, the gold balls 160, and the solder joints 165 shown in FIG. 1 have been replaced with a surface finish such as a finish selected from the group consisting of immersion tin, immersion gold, ENIG (electroless nickel immersion gold), and ENEPIG (electroless nickel electroless palladium immersion gold). As is the case in other embodiments described herein, the conductive traces in the redistribution layer 145 may be composed of copper.

Figure 8:
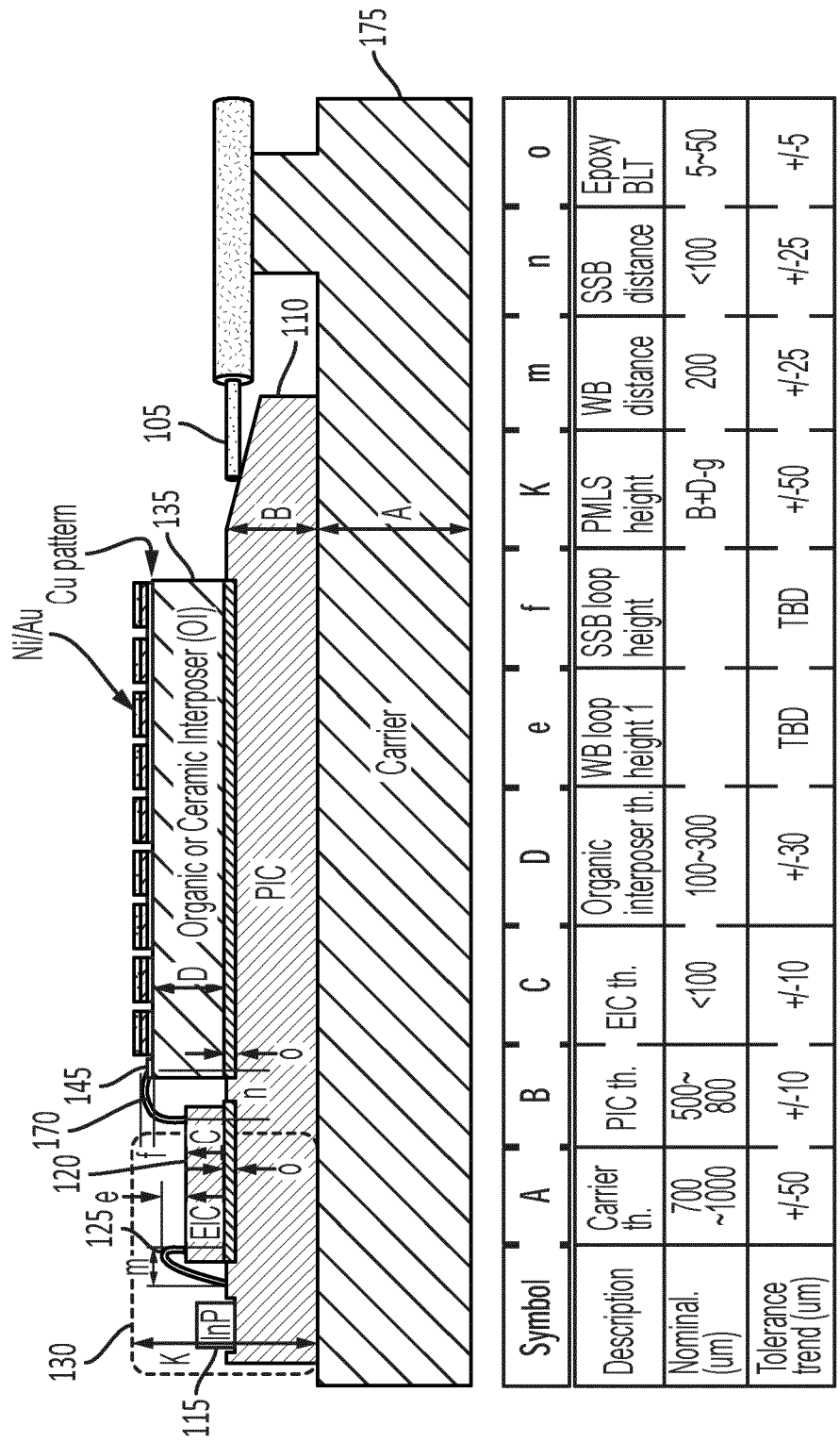
FIG. 8 is a side cross sectional view of an optical engine and an associated table of dimensions, according to an embodiment of the present disclosure.

Similarly, FIG. 8 shows an organic heterogeneous optical engine according to some embodiments. The embodiment of FIG. 8 is similar to the embodiment of FIG. 2, with the principal difference being that in the embodiment of FIG. 8 the gold balls 160 and the solder joints 165 shown in FIG. 2 have been replaced with a nickel/gold surface finish.

The embodiments of FIGS. 7 and 8 may be employed to make a connection to a motherboard or to a digital integrated circuit in circumstances when protruding conductors, protruding significantly above the upper surfaces of the conductive traces in the redistribution layer 145, are not needed.

For example, a socket used to connect the optical engine to a motherboard or to a digital integrated circuit may have pads that have a sufficiently great standoff height that protruding conductors (such as the gold balls or copper core balls of some embodiments) on the conductive traces in the redistribution layer 145 are not needed, and may be eliminated. Similarly, if the optical engine is to be installed on a motherboard, and if balls (e.g., gold balls or copper core balls) or other conductive pads are already placed on the motherboard, then the gold balls or copper core balls in some embodiments of the optical engine may be unnecessary.

As used herein, a "gold ball" is a ball having a surface composed of gold. As such, a ball (e.g., a "gold coated ball" or an "Au coated ball") having a copper core with a coating of nickel on the copper core, and a surface coating of gold on the coating of nickel is a "gold ball" in the terminology used herein. As used herein, a "copper core ball" (or "Cu core ball") is a ball having a copper core with a coating of solder on the copper core.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "primary component" refers to a component that is present in a composition, polymer, or product in an amount greater than an amount of any other single component in the composition or product. In contrast, the term "major component" refers to a component that makes up at least 50% by weight or more of the composition, polymer, or product. As used herein, the term "major portion", when applied to a plurality of items, means at least half of the items. As used herein, any structure or layer that is described as being "made of" or "composed of" a substance should be understood (i) in some embodiments, to contain that substance as the primary component or (ii) in some embodiments, to contain that substance as the major component.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present. As used herein, "a portion of" something means all, or less than all, of the thing. As such, for example "a portion of a layer" means all or less than all of the layer.

Any numerical range recited herein is intended to include all sub-ranges of the same numerical precision subsumed within the recited range. For example, a range of "1.0 to 10.0" or "between 1.0 and 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a siliconized heterogeneous optical engine have been specifically described and illustrated herein, many modifications and variations will be apparent to those skilled in the art. Accordingly, it is to be understood that a siliconized heterogeneous optical engine constructed according to principles of this disclosure may be embodied other than as specifically described herein. The invention is also defined in the following claims, and equivalents thereof.

What is claimed is:
1. A system, comprising:
a photonic integrated circuit (PIC) having a top surface, a cavity in the top surface of the PIC, and a V-groove in the top surface of the PIC;
an electro-optical chip in the cavity in the top surface of the PIC;

an optical fiber in the V-groove, a first waveguide in the PIC forming an optical connection between the optical fiber and a second waveguide in the electro-optical chip, and the cavity in the top surface of the PIC being configured to vertically align the second waveguide in the electro-optical chip with the first waveguide in the PIC;

an electronic integrated circuit, bonded to the top surface of the PIC by a first layer of epoxy;

an interposer, bonded to, and being positioned entirely above, the top surface of the PIC by a second layer of epoxy separated from the first layer of epoxy, the interposer being spaced apart on the top surface of the PIC from the electronic integrated circuit and from the electro-optical chip;

a redistribution layer, on a top surface of the interposer, the redistribution layer comprising a plurality of conductive traces; and a plurality of protruding conductors, on the conductive traces of the redistribution layer and configured to attach to a digital integrated circuit, the electronic integrated circuit being positioned entirely above the PIC and entirely between the electro-optical chip and the interposer, a height of the top surface of the electronic integrated circuit from the top surface of the PIC being less than a height of the top surface of the interposer from the top surface of the PIC, the electronic integrated circuit being electrically connected to the electro-optical chip along a first electrical path that extends through a first conductive trace on the PIC and a wire bond that extends between the first conductive trace and the top surface of the electronic integrated circuit, a height of the wire bond from the top surface of the PIC being greater than the height of the top surface of the electronic integrated circuit from the top surface of the PIC, the electronic integrated circuit being electrically connected to a second conductive trace of the plurality of conductive traces of the redistribution layer along a second electrical path separate from the first electrical path, the second electrical path extending through a standoff stitch bond that extends from the top surface of the electronic integrated circuit to the second conductive trace, a height of the standoff stich bond from the top surface of the PIC being greater than the height of the top surface of the interposer from the top surface of the PIC, wherein the system further comprises a lid enclosing the electro-optical chip, the wire bond, only a portion of the PIC, and only a portion of the electronic integrated circuit, the standoff stitch bond being outside of the lid, and wherein:
the electro-optical chip comprises an optical modulator configured to convert unmodulated light into light modulated with data, and the electronic integrated circuit comprises a driver circuit configured to drive the optical modulator; or the electro-optical chip comprises a photodetector, and the electronic integrated circuit comprises a transimpedance amplifier connected to the photodetector.

2. The system of claim 1, wherein the interposer is composed of silicon.

3. The system of claim 2, wherein the interposer comprises an upper surface passivation layer composed of silicon dioxide.

4. The system of claim 1, wherein one of the protruding conductors comprises:
a copper post, and
a gold ball on the copper post.

5. The system of claim 4, wherein the gold ball is secured to the copper post with solder.

6. The system of claim 1, wherein the interposer is composed of an organic compound or a ceramic compound.

7. The system of claim 6, wherein one of the protruding conductors comprises a gold ball on the redistribution layer.

8. The system of claim 7, wherein the gold ball is secured to the redistribution layer with solder.

9. The system of claim 6, wherein one of the protruding conductors comprises:
a solder ball, and
a gold ball on the solder ball.

10. The system of claim 1, wherein the interposer has a thickness of between 50 microns and 500 microns.

11. The system of claim 1, wherein the electro-optical chip has a top surface at a height, above the top surface of the photonic integrated circuit, of less than 200 microns.

12. The system of claim 1, wherein the wire bond extends to a height of at most 100 microns above the top surface of the electro-optical chip.

13. The system of claim 1, wherein the standoff stitch bond extends to a height of at most 50 microns above the top surface of the interposer.

* * * * *